(12) United States Patent
Lee et al.

(10) Patent No.: US 6,645,574 B1
(45) Date of Patent: Nov. 11, 2003

(54) METHOD OF FORMING A THIN FILM

(75) Inventors: Chun-Soo Lee, Taejon (KR); Won-Gu Kang, Taejon (KR); Kyu-Hong Lee, Taejon (KR); Kyoung-Soo Yi, Taejon (KR)

(73) Assignee: Genitech, Inc. (KR)

( * ) Notice: Subject to any disclaimer, the term of this patent is extended or adjusted under 35 U.S.C. 154(b) by 0 days.

(21) Appl. No.: 09/719,103
(22) PCT Filed: Apr. 6, 2000
(86) PCT No.: PCT/KR00/00310
§ 371 (c)(1), (2), (4) Date: Dec. 6, 2000
(87) PCT Pub. No.: WO00/63957
PCT Pub. Date: Oct. 26, 2000

(30) Foreign Application Priority Data

Apr. 6, 1999 (KR) .......................................... 11-011877

(51) Int. Cl.$^7$ .............................................. C23C 16/06
(52) U.S. Cl. .................. 427/576; 427/578; 427/255.28; 427/252; 117/88; 117/92; 117/93; 117/102; 117/103
(58) Field of Search .............................. 117/88, 92, 93, 117/102, 103; 438/680; 427/576, 578, 255.28, 2, 252

(56) References Cited

U.S. PATENT DOCUMENTS

| 5,916,365 | A | 6/1999 | Sherman | 117/92 |
| 6,200,893 | B1 * | 3/2001 | Sneh | 117/92 |
| 6,342,277 | B1 * | 1/2002 | Sherman | 117/103 |

FOREIGN PATENT DOCUMENTS

| EP | 0843347 | A2 | 5/1998 |
| JP | 03-048421 | | 3/1991 |
| JP | 405186868 | A | 7/1993 |
| JP | 06-291048 | | 10/1994 |
| KR | WO 0079576 | A | 12/2000 |

OTHER PUBLICATIONS

S. Tanimoto et al., "Synchronously Excited Discrete Chemical Vapor Deposition of $Ta_2O_5$,", J. Electrochem.Soc. vol. 141, No. 5, May 1994.

Ken Inoue, et al., "A New Cobalt Salicide Technology for 0.15 $\mu$m CMOS Devices," IEEE Transactions on Electron Devices vol. 45, No. 11, Nov. 1998.

Ritala M. et al., "Atomic Layer Epitaxy Growth of TiN Thin Films," Journal of the Electrochemical Society, Electrochemical Society, vol. 142, No. 8, Aug. 1995 (Aug. 1995), pp. 2731–2737.

Kenji Hiramatsu et al., "Formation of TiN Films with Low CL concentration by Pulsed Plasma Chemical Vapor Deposition," Journal of Vacuum Science and Technology: Part A, American Institute of Physics, New York, US, vol. 14, No. 3, Part 1, May 1996, pp. 1037–1040.

* cited by examiner

*Primary Examiner*—Timothy Meeks
(74) *Attorney, Agent, or Firm*—Marger Johnson & McCollom, P.C.

(57) ABSTRACT

A noble method of forming thin films for producing semiconductor or flat panel display devices is disclosed. The method is a way of effectively forming thin films on a substrate even if reactants do not react readily in a time-divisional process gas supply sequence in a reactor by supplying reactant gases and a purge gas cyclically and sequentially in order to prevent gas-phase reactions between the reactant gases and also by generating plasma directly on a substrate synchronously with the process gas supply cycle. The method has advantages of effective thin film formation even if the reactant gases do not react readily, minimization of the purge gas supply time for reduction in process time, reduction of particle contamination during film formation process, as well as thin film formation at low temperatures.

11 Claims, 4 Drawing Sheets

METHOD OF FORMING A THIN FILM

TECHNICAL FIELD

The present invention relates to a deposition method of thin films required for manufacturing semiconductor devices, flat panel devices, and etc.

BACKGROUND ART

Such thin films may include metal films, insulator films such as metal oxide films, metal nitride films and etc., films for capacitors, interconnects and electrodes, inorganic films used for diffusion prevention, and etc.

These thin films may be formed by a physical vapor deposition, for example a sputtering process. The sputtering process, however, forms thin films with poor step coverage, so a chemical vapor deposition method is usually employed to improve the step coverage.

One of the most common chemical vapor depositions of the prior art is carried out by an apparatus as shown in FIG. 1A. Referring to FIG. 1A, process gases or other reactants 11, 12, 13 are supplied into a reactor 1, respectively, through mass flow controllers 21, 22, 23 and valves 30, 31, 32. In this case, a shower head 4 is utilized to obtain uniform flow 5 of the process gases. When a source material is liquid or solid having low equilibrium vapor pressures, a vaporizer 16 is also employed that can heat the source material in a suitable temperature to vaporize and can supply the vaporized source material into the reactor 1 with the carrier gas 13. When the vaporizer is employed, the initial portion of the source material carried by the carrier gas 13 is exhausted via a bypass valve 33 and an outlet tube 18 due to the fluctuation of flow rate and source material concentration. Then, the bypass valve 33 is shut off and a valve 32 connected to a central supplying tube 17 is opened to supply the carrier gas into the reactor 1.

The chemical vapor deposition of the prior art performed in this apparatus has the following features: At first, all process gases 11, 12, 13 required for the deposition are supplied into the reactor 1 at the same time so that the film is continuously deposited during the process times 11', 12', 13' as in an example shown in FIG. 1B. At second, the shower head 4 is usually employed to make uniform flow 5 of the process gases on the surface of a substrate.

This method has the following disadvantages: At first, since all process gases exist within the reactor at the same time, the process gases may react in gas phase thereby can deteriorate step coverage of the deposited film and/or produce particles which contaminate the reactor. At second, when using a metal-organic compound as a source material, it is difficult to deposit the film that does not contain carbon impurities. At third, in the case of depositing a multi-component film, all the reactant materials must react simultaneously while the supply of each reactant material is controlled separately by mass flow of the carrier gas, so it is very difficult to control the composition of the deposited film precisely.

To overcome the foregoing problems, a method is proposed in which the process gases are supplied separately as time-divisional pulses rather than supplied continuously.

An example of supplying process gases in this deposition method is shown in FIG. 2A. Valves in a gas introducing part can be opened or closed so that the process gases can be supplied cyclically as time-divisional pulses into the reactor without being mixed with each other.

Referring to FIG. 2A, it can be seen that the process gases 11, 12, 13 in FIG. 1A are supplied in a cycle $T_{cycle}$ of 13', 12', 11' and 12'. A film can be deposited by repeating this cycle. In general, purge gas 12 is supplied between the supply pulses of the reactants 11 and 13 so that the remaining reactants are removed from the reactor before the next reactant is supplied.

Hereinafter, a time-divisional deposition mechanism will be described. Chemical adsorption temperatures of the reactants onto the substrate are generally lower than thermal decomposition temperatures of the reactants. Therefore, when a deposition temperature is maintained higher than the chemical adsorption temperature of the reactant onto the substrate and lower than the thermal decomposition temperature of the reactant, the reactant supplied into the reactor only adsorbs chemically onto the surface of the substrate rather than decomposes. Then, the remaining reactant is exhausted out of the reactor by the purge gas supplied into the reactor. After that, another reactant is introduced into the reactor to react with the reactant adsorbed on the surface, and thus form a film. Because the reactant adsorbed on the substrate cannot form more than one molecular layer, film thickness formed in one supply cycle $T_{cycle}$ is constant regardless of amount or time of the supplied reactants. Therefore, as shown in FIG. 2B, the deposited film thickness is saturated as the supplying time elapses. In this case, the deposited film thickness is controlled only by the number of the repeated supply cycles.

In the other hand, when the deposition process temperature is no lower than the thermal decomposition temperature of the reactants, the deposited film thickness is proportional to the supply time of the reactants in the supply cycle because the reactants introduced into the reactor decompose continuously to form films on the substrate. In this case, deposited film thickness according to the supply time of the reactants is shown in FIG. 2C.

However, the foregoing time-divisional deposition has problems as follows:

At first, the reactants used in the deposition process must react readily. Otherwise it is difficult to form a film by time-divisional deposition. In this case, a method is required that facilitate the chemical reaction even at low temperatures.

At second, the exhausting part of the apparatus may be contaminated with particles due to the reactions between the reactants. The gas-introducing part and the reactor may not be contaminated with the particles due to the reactions of the reactants because the reactants are separated by the purge gas. In the other hand, the exhausting part may be easily contaminated with particles because the reactants mix and react with each other at exhaust.

At third, it is required to supply inert purge gas between the reactant supply pulses to prevent gas-phase reactions in the gas-introducing part and the reactor, so the gas-supply cycle is complex, the time for a supply cycle is longer than absolutely necessary, and thus the deposition is slow.

A method is disclosed in the U.S. Pat. No. 5,916,365 in which a film is formed by repeating a gas-supply cycle, i.e., supplying first reactant gas into a reactor, exhausting remaining reactant gas within the reactor by a vacuum pump, supplying second reactant gas which is activated by passing through a radical generator using an RF power or other means, and exhausting remaining reactant gas by the vacuum pump.

The exhaust rate of the vacuum pump decreases as the pressure decreases, so it takes long time to exhaust the remaining reactant gases from the reactor with the vacuum pump. Therefore, in this method, it is difficult to have high growth rate of the film per unit time when it desired to exhaust the remaining reactant gases completely. When the exhausting time is too short, the reactant gases remain in the reactor so that the two reactant gases mix and react in gas phase. Furthermore, in the method of the U.S. Pat. No. 5,916,365, it is difficult to maintain stable plasma in the reactor because the supply and exhaust of the reactant gases cause wide pressure variation in the reactor.

DISCLOSURE OF INVENTION

Therefore, it is an object of the present invention to provide a method which can form a thin film effectively even if reactants do not react readily in a time-divisional source supply chemical vapor deposition method.

It is another object of the present invention to provide a method which can minimize supply time of a purge gas in a gas-supplying cycle to reduce cycle time in a time-divisional source supply chemical vapor deposition.

It is further object of the present invention to provide a method which can reduce particle contamination of the apparatus at the exhausting part of an apparatus for time-divisional source supply chemical vapor deposition.

In order to realize those foregoing objects, the present invention provides a method used for a chemical vapor deposition in which source gases for forming a thin film are supplied into a reactor in a time-divisional manner so that they may not be mixed with each other in the reactor. In the method of the invention, the process gases are activated into plasma to faciliate the film formation, wherein plasma is generated synchronously with gas supply cycle.

For more clear description, process gases are classified as three kinds:

At first, the process gas that thermally decomposes to form a solid film is called a deposition gas. The deposition gas includes, for example, titanium-organic compound used for chemical vapor deposition for forming a TiN film.

At second, the process gas that does not decompose by itself or does not form a solid film upon self-decomposition, however, forms a solid film when reacts with a deposition gas is called a reactant gas. The reactant gas includes, for example, ammonia used in a chemical vapor deposition process for forming a nitride film, and oxygen gas used in a chemical vapor deposition process for forming a oxide film.

At third, the other inert process gas that is supplied between the supplies of the deposition gas and the reactant gas to separate the deposition gas and the reactant gas is called a purge gas. In general, helium, argon, nitrogen gas and etc. are used for a purge gas. Those gases contain the constituent element of the film may also used for a purge gases if they do not react with a deposition gas. In this case, the purge gas can be used for a reactant gas when activated by plasma.

Therefore, one of the most evident features of the present invention, in a chemical vapor deposition which forms a film on a substrate by supplying process gases which include a deposition gas, a reactant gas, and a purge gas into a reactor by repeating cycles of time-divisional gas supply, is to provide a method of generating plasma on the substrate synchronously with the supply cycles to activate at least one of the process gases. In this case, the plasma is generated synchronously with the supply cycle of the reactant gas.

Also, when a purge gas contains constituent elements of a film material and a reactant gas contains the other constituent elements of the film material and the purge gas does not substantially react with the reactant gas, plasma may be preferably generated synchronously during the supply cycle of the purge gas.

In the other hand, a film is deposited by alernate supply of only a deposition gas and a purge gas without any reatanct gas into a reactor. In this case, the purge gas preferably contains constituent elements of a film material and does not react substantially react with the deposition gas if not activated; wherein plasma is preferably generated synchronously at least in part during the supply cycle of the purge gas to facilitate the reaction of the purge gas with the deposition gas.

The films deposited by above methods may be heat-treated after the deposition.

BEST MODE FOR CARRYING OUT THE INVENTION

Figure 3A:
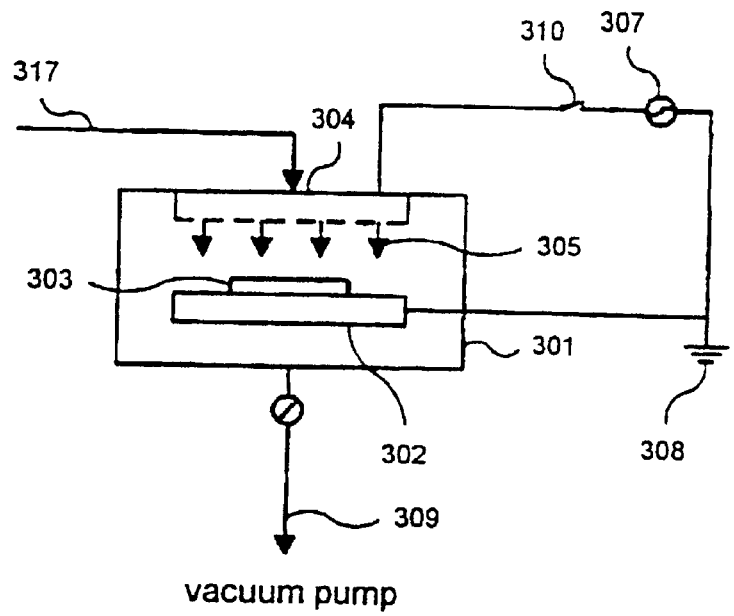
FIG. 3A to FIG. 3C are a schematic view of an apparatus to be employed to the present invention and graphs for illustrating a gas supplying method, respectively.

Preferred embodiments of the present invention will be described hereinafter in reference to the appended drawings:

FIG. 3A is a schematic view of an apparatus to be employed to the present invention.

Figure 1A:
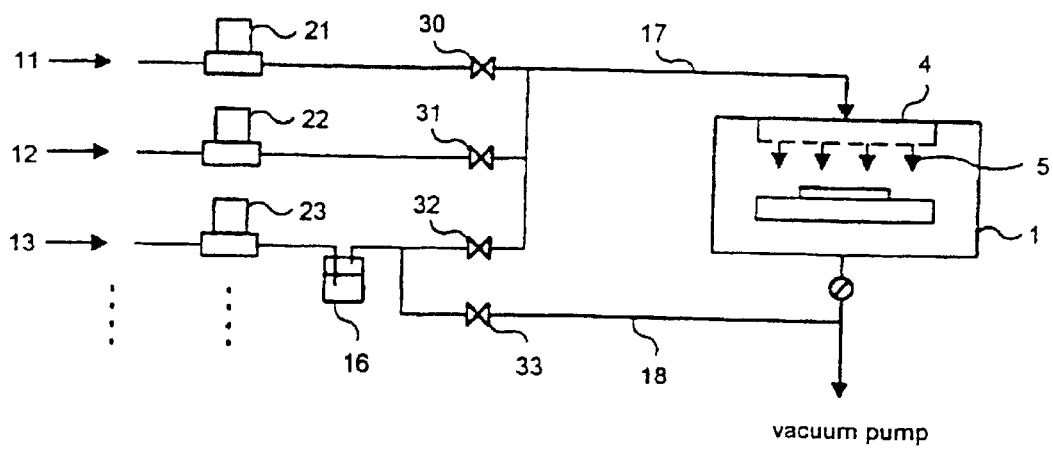
FIG. 1A and FIG. 1B are drawings showing an apparatus for a chemical vapor deposition and a method of supplying reactant gases employed in a film deposition process of the prior art.
Figure 1B:
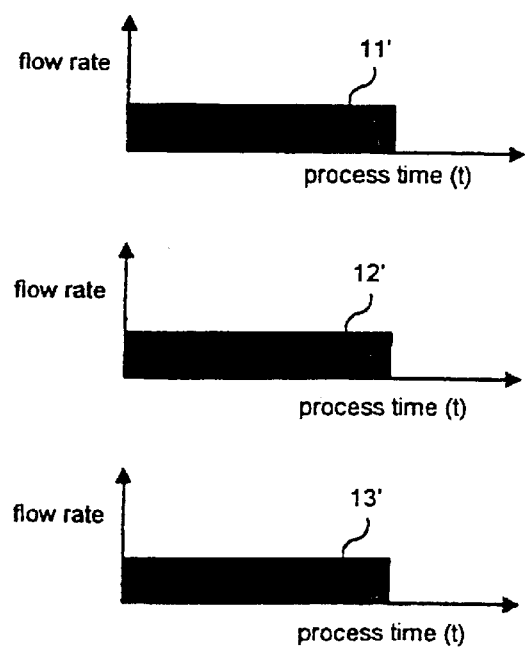
Figure 2A:
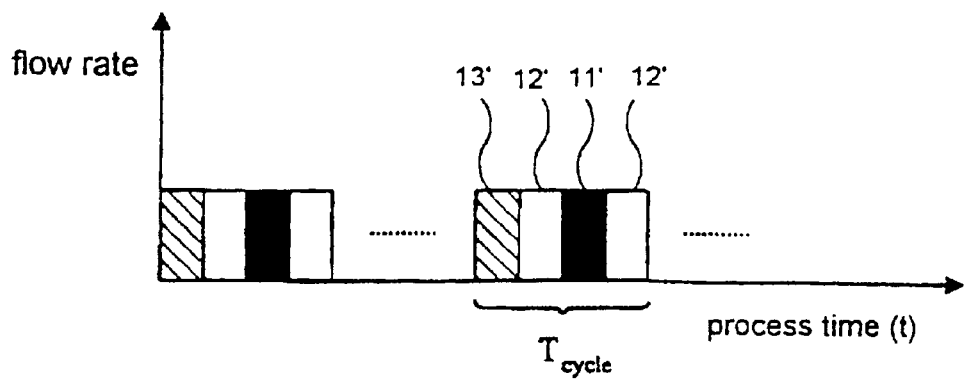
FIG. 2A to FIG. 2C are graphs showing a deposition process of the prior art which supply reactant gases in a time-divisional manner.
Figure 2B:
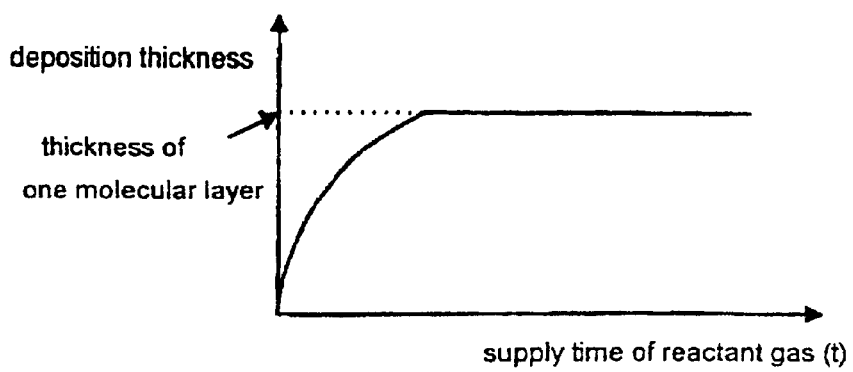
Figure 2C:
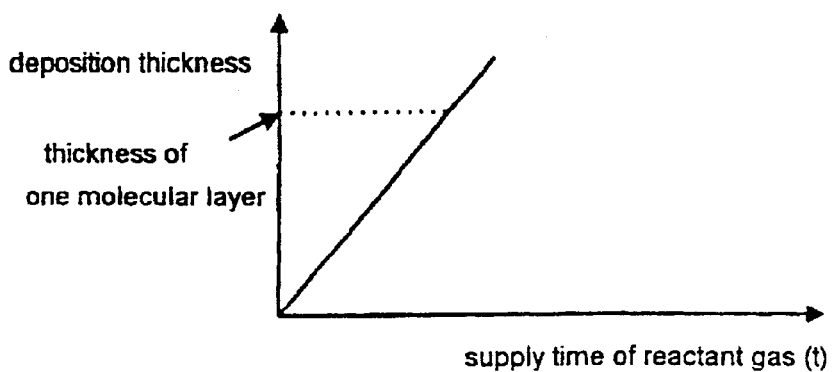

Referring to FIG. 3A, the apparatus is same as that of FIG. 1A, except that a plasma generator is attached thereto. RF(radio frequency) power is applied into a reactor 301 via an RF power supply 307 which is connected to a gas shower head 304 and a susceptor 302 so that plasma can be generated on a substrate 303. When RF power from the RF power supply 307 is cyclically applied into the reactor by turning on and off a switch 310 with the supply cycle of gases, plasma can be synchronously generated with the gas supply cycle. Gases are supplied through a supply tube 317, and the shower head 304 is adapted for the purpose of obtaining uniform flow 305 of process gases on the surface of the substrate 303 as in the prior art.

First embodiment of the present invention which is carried out by the apparatus shown in FIG. 3A will be described in reference to the graphs in FIG. 3B and FIG. 3C.

Figure 3B:
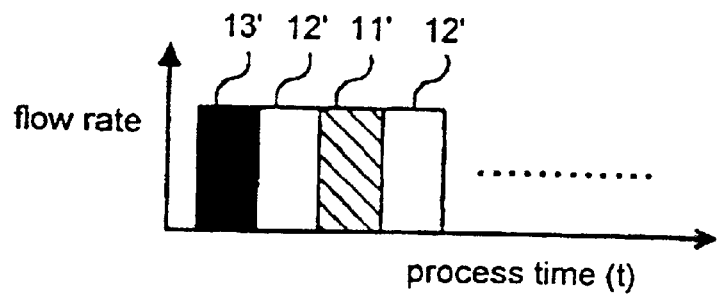
Figure 3C:
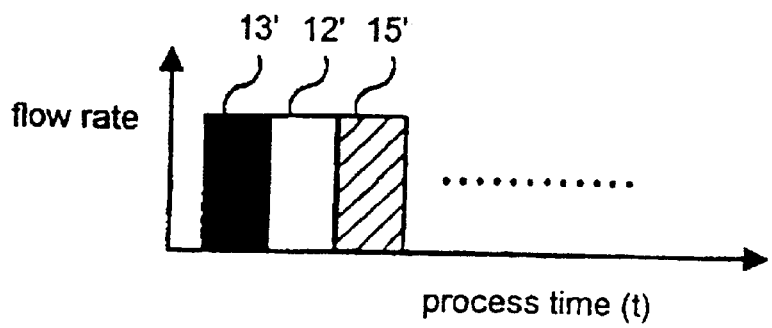

FIG. 3B is a graph showing that the process gases are supplied into the reactor in the supply cycle of deposition gas 13', purge gas 12', reactant gas 11' and purge gas 12'. At first, the deposition gas 13' is supplied into the reactor to be adsorbed to the substrate, and then the purge gas 12 is supplied to remove the remaining deposition gas from the reactor. Then, the reactant gas 11' is supplied into the reactor and at the same time the switch 310 is closed to activate the reactant gas 11' with plasma, and thus facilitate chemical reaction with the deposition gas 13' adsorbed onto the substrate. When supply of the reactant gas is interrupted, the switch 310 is opened to stop plasma generation and the purge gas 12' is introduced to remove the remaining reactant gas. In this method, the film can be formed even if the reaction between the deposition gas 13' and reactant gas 11 is weak because the reactant gas 11 is activated with plasma.

For example, when a metal-organic compound is used as chemical vapor deposition source, plasma-activated reactant gas may accelerate decomposition of the metal-organic compound and reduce carbon contamination of the film. Also, the activation energy applied to the film by the plasma may enhance crystallization, physical characteristics and electrical characteristics of the film.

As a detailed example of this process, a copper compound may be reduced to form a metallic copper film. In the temperature no higher than thermal decomposition temperature of the deposition gas, chemical reaction between the deposition gas and hydrogen gas, i.e. the reactant gas, does not take place and thus a metallic copper film cannot be formed. Therefore, a plasma generator as shown in FIG. 3A is installed, and plasma is generated as hydrogen gas is supplied into the reactor so that chemical reaction between the hydrogen gas and the copper source adsorbed to the substrate surface may be accelerated and thus form a metallic copper film. If the plasma generator is powered on while supplying the deposition gas, the copper source may decompose in gas phase so that particle contamination or poor step coverage may take place. Therefore, it is advantageous to synchronize RF power applied to the plasma generator with the supply cycle in such a manner that the plasma generator is powered off when the deposition gas is supplied and on only when the reactant gas is supplied.

According to second embodiment of the present invention, a gas that may undergo a very weak chemical reaction with the deposition gas, if any, may be employed as a reactant gas or a purge gas, in condition that this gas contains constituent elements of the film. A gas supplying method like this is shown in FIG. 3C. In this method, the deposition gas 13' is primarily adsorbed to the substrate, the remaining deposition gas is removed by the purge gas 12' which undergoes almost no chemical reaction with the deposition gas, if any, but may include constituent elements of the film, and then the plasma generator is powered on to transform the purge gas 12' into the reactant gas 15'. This reactant gas 15' can form a film by reacting with the deposition gas absorbed to the substrate. Then, after the plasma generator is powered off to stop the reaction, the deposition gas 13' can be supplied again into the reactor without any concerns about gaseous reaction. Therefore, during purge gas supply in the gas supply cycle, the plasma power supply is switched in the order of off, on, and off, thereby is equivalent of supplying a purge gas, a reactant gas and a purge gas, respectively. Also, the concentration of the activated species decreases very rapidly after the plasma power is turned off, so supply time of the purge gas can be minimized after the plasma power is off. In this kind of gas supply cycle, the gas-supply cycle consists of turn-on and turn-off of plasma generator instead of the supply of different gases. This method permits the time-divisional chemical vapor deposition with only two kinds of gases, so the gas supplying part of an appratus can be simple and the cycle time of gas supply can be reduced. Furthermore, the deposition gas and the purge gas do not react with each other even if mixed, so there is no concerns about the particle contamination in the exhausting part.

Both of the foregoing two embodiments can be employed for the deposition of TiN film which is used for diffusion barrier as well as adhesive and anti-reflectory coatings.

Using the first embodiment, a TiN film may be formed by repeating the cycle of the supply of Ti-organic source for a deposition gas, ammonia gas for a reactant gas, and nitrogen gas for a purge gas, in which plasma is generated when the reactant gas is supplied.

When employing the second embodiment, Ti-organic source is used for a deposition gas, nitrogen gas for a purge gas, respectively, in which the plasma generator is powered on thereby causing the absorbed deposition gas to react with nitrogen gas after the deposition gas is removed by nitrogen gas. A TiN film may be formed by repeating the cycle including these steps. In this case, the nitrogen purge gas never reacts with the deposition gas when the plasma power supply is off so that particle is not generated at all.

Figure 4A:
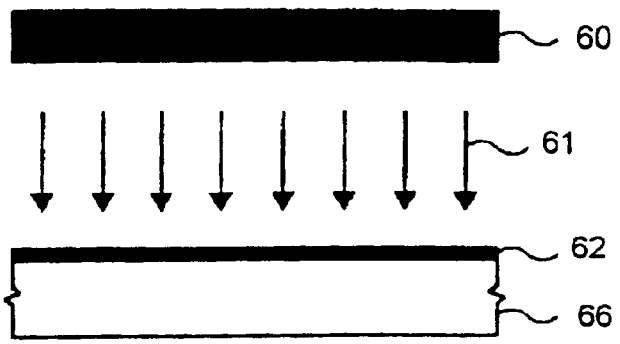
FIG. 4A to FIG. 4C are drawings showing processes for forming a multi-component film by using the method of the present invention.
Figure 4B:
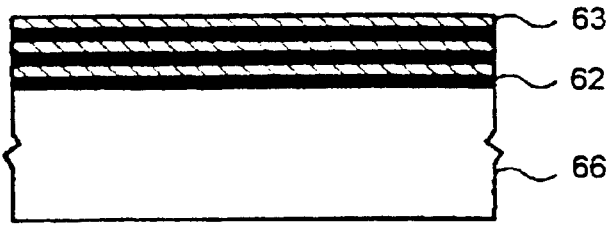
Figure 4C:
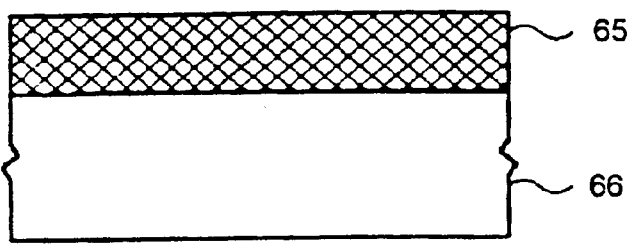

FIG. 4A to FIG. 4C are drawings showing steps of forming a multi-component film by employing a method of the present invention.

FIG. 4A illustrates a process of forming a single-component film 62 on the substrate 66 by a simple process cycle. For example, a metal-organic source is chemisorbed to the substrate, and a reactant gas is supplied with plasma power turned on, and thus a film 62 is formed which contains the metal element contained in the metal-organic source.

FIG. 4B shows that the process of FIG. 4A is repeatedly applied to form different layers 62 and 63. Herein, a film is formed with a desired thickness and composition by alternatively forming layers 62, 63 with different composition which may contain different elements. The layers 62 and 63 can be as thin as an atomic layer, so the deposited film is sufficiently homogeneous, which may be transformed to thermodynamically more stable phase 65 after thermal treatment.

INDUSTRIAL APPLICABILITY

In the method of the present invention, a chemical vapor deposition of supplying process gases in a time-divisional manner is adapted with an idea of generating plasma synchronously with source supply cycle. Therefore, this method can be effectively applied for forming films which include metal components such as metal films, metal oxide films and metal nitride films which are used for semiconductor and flat panel display devices.

Herein above the invention has been described in reference to the preferred embodiments, but various other modifications and variations will be apparent to those skilled in the art without departing from the scope and spirit of the present invention.

What is claimed is:

1. A method for forming a thin film on a substrate in a reactor, said method comprising;

supplying a deposition gas into a reactor to adsorb said deposition gas onto a surface of a substrate;

supplying a purge gas into said reactor to remove said deposition gas un-adsorbed onto said substrate, wherein said purge gas does not substantially react with said deposition gas;

turning on plasma in said reactor, wherein said purge gas in said reactor becomes active and reacts with said deposition gas adsorbed onto the surface of said substrate to form a thin film; and turning off said plasma in said reactor so that the reaction between said activated purge gas and said deposition gas ceases, whereby said activated purge gas becomes inactive immediately after said plasma is turned off, wherein said purge gas contains at least one constituent element of the thin film.

2. The method of claim 1, further comprising:

repeating the process steps recited in claim 1 one or more times.

3. The method of claim 1, wherein, after turning off said plasma, the method further comprises supply said purge gas to said reactor to replace the remaining gas in said reactor.

4. The method of claim 3, comprising:

repeating the process steps recited in claim 3, one or more times.

5. The method of claim 1, wherein said constituent element is nitrogen.

6. The method of claim 1, wherein said deposition gas is a Ti-organic source and said purge is a nitrogen gas.

7. A method for forming a thin film on a substrate in a reactor, the method comprising;

supplying a deposition gas into a reactor to adsorb said deposition gas onto a surface of a substrate;

supplying a purge gas into said reactor to remove said deposition gas un-adsorbed onto said substrate;

supplying a reactant gas into said reactor, wherein said reactant gas does not substantially react with said deposition gas;

turning on plasma in said reactor, wherein said reactant gas in said reactor becomes active and reacts with said deposition gas adsorbed onto the surface of said substrate to form a thin film; and turning off said plasma in said reactor so that the reaction between said activated reactant gas and said deposition gas ceases, whereby said activated reactant gas becomes inactive immediately after said plasma is turned off.

8. The method of claim 7, further comprising:

repeating the process steps recited in claim one or more times.

9. The method of claim 7, wherein, after said step of turning off said plasma, the method further comprises:

supplying said purge gas to said reactor to replace the remaining gas in said reactor.

10. The method of claim 9, further comprising:

repeating the process steps recited in claim 9, one or more times.

11. The method of claim 7, wherein said deposition gas is a copper compound and said reactant gas is a hydrogen gas.

* * * * *

UNITED STATES PATENT AND TRADEMARK OFFICE
CERTIFICATE OF CORRECTION

PATENT NO. : 6,645,574 B1
DATED : November 11, 2003
INVENTOR(S) : Lee et al.

It is certified that error appears in the above-identified patent and that said Letters Patent is hereby corrected as shown below:

Column 7,
Line 7, "claim 3, comprising:" should read -- claim 3, further comprising: --.
Line 8, "claim 3, one or" should read -- claim 3 one or --.
Line 13, "said purge is" should read -- said purge gas is --.

Column 8,
Line 11, "in claim one" should read -- in claim 7 one --.
Line 18, "in claim 9, one" should read -- in claim 9 one --.

Signed and Sealed this

Twenty-ninth Day of June, 2004

JON W. DUDAS
*Acting Director of the United States Patent and Trademark Office*